United States Patent [19]

Lin et al.

[11] Patent Number: 4,534,838
[45] Date of Patent: Aug. 13, 1985

[54] SILOXANE POLYPHOTOINITIATORS OF THE SUBSTITUTED ACETOPHENONE TYPE

[75] Inventors: Samuel Q. S. Lin, Fort Lee, N.J.; Anthony F. Jacobine, Meriden, Conn.

[73] Assignee: Loctite Corporation, Newington, Conn.

[21] Appl. No.: 655,398

[22] Filed: Sep. 27, 1984

Related U.S. Application Data

[63] Continuation-in-part of Ser. No. 600,628, Apr. 16, 1984, abandoned.

[51] Int. Cl.³ .............................................. C08F 2/46
[52] U.S. Cl. ................................. 204/159.13; 528/15; 528/33; 528/34; 528/24; 528/25; 528/26; 528/29; 528/37; 556/436
[58] Field of Search ................ 556/436; 204/159.13; 528/33, 34, 15, 37, 24, 25, 26, 29

[56] References Cited

U.S. PATENT DOCUMENTS

| | | | |
|---|---|---|---|
| 4,273,907 | 6/1981 | Takamizawa et al. | 528/29 |
| 4,391,963 | 7/1983 | Shirahata | 528/37 |
| 4,467,082 | 8/1984 | Shirahata et al. | 528/43 |
| 4,477,326 | 10/1984 | Lin | 204/159.13 |
| 4,503,208 | 3/1985 | Lin et al. | 528/15 |
| 4,507,187 | 3/1985 | Lin et al. | 204/159.13 |

*Primary Examiner*—Melvyn I. Marquis
*Attorney, Agent, or Firm*—Walter J. Steinkraus; Eugene F. Miller

[57] ABSTRACT

An organopolysiloxane photoinitiator having an average of at least two siloxane units, of which at least an average of one siloxane unit per organopolysiloxane molecule has the formula:

$$X_aR_bSiO_{(4-a-b)/2} \quad (I)$$

wherein a is an integer of 1–3, b is an integer of 0–2 and a plus b equals 1–3; R is $C_1$–$C_{10}$ hydrocarbyl or halogen substituted $C_1$–$C_{10}$ hydrocarbyl; and X is a substituted acetophenone photomoiety selected from:

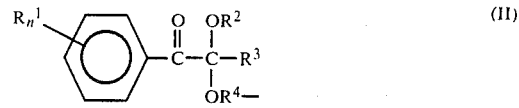
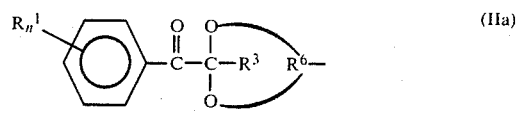
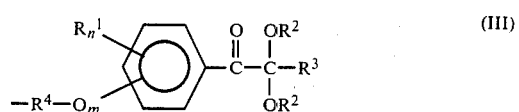
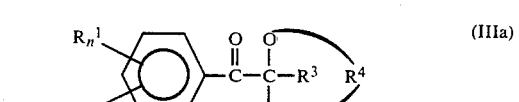
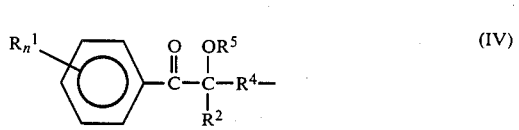
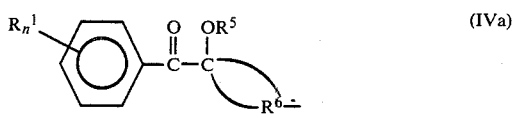

where $R^1$ is any substituent which will not interfere with hydrosilation, n is an integer between 0 and 5 in formulas (II), (IIa), (III), (IIIa), (IV) and (IVa) and between 0 and 4 in formula (III) and (IIIa); m is 0 or 1; $R^2$ is alkyl or substituted alkyl; $R^3$ is H, alkyl or aryl; $R^4$ is a divalent hydrocarbon group having between 2 and 10 carbon atoms or an alkylene oxy alkylene group; $R^5$ is a group selected from H, alkyl, aryl, organosilyl, or the reaction product of an isocyanate esterification reagent or an etherification reagent with the hydroxyl product formed when $R^5$ is H and $R^6$ is a trivalent hydrocarbon or hydrocarbon oxyhydrocarbon group.

The silicones are prepared by hydrosilation of the corresponding olefinically or acetylenically unsaturated acetophenones.

14 Claims, No Drawings

SILOXANE POLYPHOTOINITIATORS OF THE SUBSTITUTED ACETOPHENONE TYPE

This application is a continuation-in-part of U.S. Ser. No. 600,628 filed Apr. 16, 1984 and now abandoned.

BACKGROUND OF THE INVENTION

Many photoinitiators have been developed which are soluble in, and effectively cure, unsaturated organic resins. However, it has been found that such photoinitiators often have limited solubility, and therefore reduced curing effectiveness, in silicones. To overcome this compatibility problem, it has been proposed chemically bond certain photoinitiating moieties to silicones.

A Japanese patent publication, Kokai No. 34,291/76 describes the use of benzophenone derivatives, such as 4-dimethylamino-4'-(trimethoxysilylbenzophenone, in preparing the silicone compatible photoinitiators.

Another Japanese patent publication, Kokai No. 71,199/78, describes the preparation of photoinitiators from the reaction of alkenylsilylbenzophenone and silicones containing silicon hydrides.

Japanese patent publication Kokai No. 50,067/79 and U.S. Pat. No. 4,273,907, describe benzoin type photoinitiators attached to the ends of polydimethylsiloxane through an Si-O-C bond. However, the Si-O-C bond is well known to be hydrolytically unstable.

In U.S. Pat. No. 4,391,963 and in co-pending application No. 505,588, filed June 20, 1983, now U.S. Pat. No. 4,477,326 there are described silicones having benzoin photomoieties bonded thereto through Si—C bonds. These materials are prepared by hydrosilation of alkenyl substituted benzoins.

In co-pending application Ser. No. 528,287, filed Aug. 31, 1983, there are described Si—H functional siloxy compounds having various alkyl-aryl ketone photoinitiating moieties bound to silicon. These compounds are also prepared by hydrosilation of appropriate olefinically or acetylenically unsaturated photomoieties.

In EPO publication No. 0,088,842 there are described silicon bonded benzophenone polyphotoinitiators prepared by hydrosilation of an alkenyloxy-substituted benzophenone.

SUMMARY OF THE INVENTION

The present invention relates to novel photoinitiating silicones in which a photomoiety of the substituted acetophenone type is bound to a silicon atom by a Si—C bond. The new photosensitive silicones are conveniently prepared by hydrosilation of corresponding acetophenones having olefinic or acetylenic unsaturation.

DETAILED DESCRIPTION OF THE INVENTION

The inventive polyphotoinitiators are organopolysiloxanes having an average of at least two siloxane units, of which at least an average of one siloxane unit per organopolysiloxane molecule has the formula:

$$X_a R_b SiO_{(4-a-b)/2} \quad (I)$$

wherein a is an integer of 1–3, b is an integer of 0–2 and a plus b equals 1–3; R is $C_1$–$C_{10}$ hydrocarbyl or halogen substituted $C_1$–$C_{10}$ hydrocarbyl; and X is a substituted acetophenone photomoiety selected from:

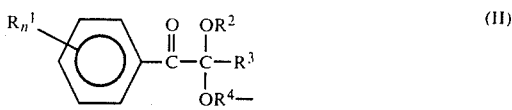

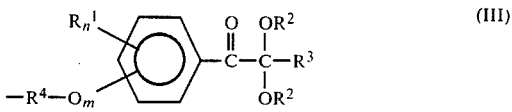

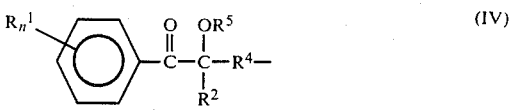

where $R^1$ is any substitutent which will not interfere with hydrosilation, n is an integer between 0 and 5 in formulas (II) and (III) and between 0 and 4 in formula (III); m is 0 or 1; $R^2$ is alkyl or substituted alkyl; $R^3$ is H, alkyl or aryl; $R^4$ is a divalent hydrocarbon group having between 2 and 10 carbon atoms; $R^5$ is a group selected from H, aryl, organosilyl, or the reaction product of an isocyanate, esterifying reagent or etherification reagent with the hydroxyl product formed when $R^5$ is H.

Suitable R groups in the above formula include alkyls such as methyl and ethyl, halogen substituted alkyls such as trifluoropropyl and aryls such as phenyl.

Suitable $R^1$ substituents include halo, alkyl, and alkoxy.

The $R^2$ groups may be linear, branched or cyclic alkyls or substituted alkyls, including methyl, ethyl, cyclohexyl, cyclooctyl, trichloroethyl, trifluoropropyl and organosilylalkyl such as (pentamethyldisiloxy)propyl and trimethylsilylpropyl. In general the $R^2$ alkyl groups may be substituted with any radical which will not interfere with hydrosilation or the photoinitiating ability of the photomoiety.

It should be understood that combined cyclic structures are intended to be encompassed within the invention. Thus, cyclic acetal or ketal structures may be formed by a carbon-to-carbon linkage of $R^2$ and $R^4$ in formula (II) or the $R^2$ groups in formula (III). Cycloaliphatic structures may be formed by a carbon-to-carbon linkage of $R^2$ and $R^4$ in formula (IV). The resulting structures may be represented by the formulas:

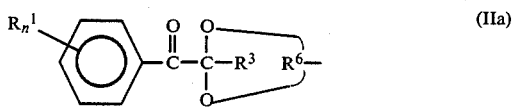

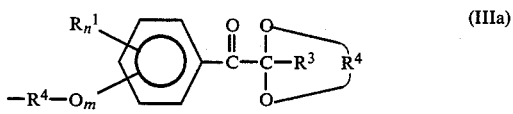

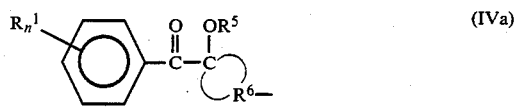

As will be readily apparent to those skilled in the art, both the open and the just described cyclic structures can be readily prepared by the synthetic methods taught herein.

The hydrosilation techniques useful for producing the inventive polyphotoinitiators are analogous to those described in the aforementioned U.S. Pat. No. 4,391,963 and co-pending application Nos. 505,588 now U.S. Pat. No. 4,477,326 and 528,287, the disclosures of which are incorporated herein by reference. Those procedures may be followed exactly except that the unsaturated benzoin or other photomoieties described in such applications are replaced on a mole-for-mole basis by the unsaturated photomoieties described below. As described in those references, SiH functional silicones may be used to directly hydrosilate the unsaturated photomoiety. Alternatively, SiH functional silanes having polymerizable functionality such as chloro or alkoxy, may be used followed by condensation of the resulting photoinitiating silane with other silanes or silicones.

Unsaturated acetophenones suitable as intermediates in the production of inventive polyphotoinitiators can be synthesized by a variety of means including (a) reaction of an alkenyl or alkynyl halide and an alkali alkoxide with an α-oxo-arylacetophenone (e.g. benzil) or an analogous α-oxo-alkylacetophenone, as exemplified in example 5 of U.S. Pat. No. 4,287,367; (b) transacetalization of an α,α-dialkoxyacetophenone with an unsaturated alcohol, followed by blocking of one of the unsaturated groups as exemplified in Example 6-7; (c) oxidative nitrosation in the presence of excess alcohol of an acetophenone having an unsaturated substituent on the aromatic ring as exemplified in Example 4; or (d) reaction of a benzaldehyde cyanohydrin silylether with a ketone having unconjugated olefinic or acetylenic unsaturation (e.g. methyl allyl ketone or 2-allylcyclohexanone), as exemplified in Example 8 and 9.

Other synthetic methods for obtaining the unsaturated intermediate photomoieties may occur to those skilled in the art without departing from the invention hereof which is illustrated by the following nonlimiting examples.

EXAMPLE 1

Benzil methyl-allyl-ketal was prepared by the procedure of Example 5 of U.S. Pat. No. 4,287,367. 2.5 grams of this compound were mixed with 30 grams of a polydimethylsiloxane containing a calculated $4.46 \times 10^{-4}$ equivalents of Si—H per gram of polymer and a calculated molecular weight of about 15,000. The mixture was heated in a flask to 100° C. 0.2 grams of chloroplatinic acid was added, causing an exotherm to 130° C. Stirring continued at 130° C. for 30 minutes. The product placed in a glass vial overnight remained clear.

EXAMPLE 2

The product of example 1 (1 gram) was mixed with 4 grams of a 12,000 molecular weight dimethylpolysiloxane terminated with acryloxypropenyl groups. The acryloxypropenyl terminated silicone is disclosed in example 4 of co-pending application Ser. No. 575,256 filed Jan. 30, 1984, now Pat. No. 4,503,208 the disclosure of which is incorporated herein by reference. The resulting clear solution, as a ¼ inch thick slug was exposed to UV irradiation of 70,000 microwatts per square centimeter for 20 seconds per side to produce a completely cured polymer mass.

EXAMPLE 3

Preparation of 4-allyloxymethylacetophenone 4-bromomethylacetophenone was prepared by mixing together 53.6 grams 4-methylacetophenone, 78.8 grams N-bromosuccinimide, 550 ml $CCl_4$ and 0.5 grams benzoyl peroxide. The mixed warm to reflux over ½ hour period and the reaction monitored via glpc and tlc until evidence of starting materials had substantially disappeared. The reaction was cooled, the cooled product isolated by evaporation of solvent and purified by distillation at 105°–109° C./0.5 mm Hg.

4-allyloxymethylacetophenone was then prepared by mixing 74 grams of purified bromomethylacetophenone, 300 ml $CHCl_3$, 40 mls $H_2O$ and 170 grams allyl alcohol, followed by addition of 30 grams NaOH and 15 grams of a 40% solution of tetra-n-butyl ammonium hydroxide. The mixture exothermed to reflux and was stirred for 4 hours. The reaction was terminated by addition of 300 mls of water. The organic phase was separated, concentrated by evaporation of solvent and the product purified by distillation at 120°–135° C./0.6 mm Hg.

EXAMPLE 4

Preparation of alpha, alpha-diethoxy-4-allyloxymethyl acetophenone

The title product was prepared by mixing the product of example 3 (47.5 grams) with 350 ml ethanol and adding 10 grams HCl gas. The temperature reached about 40° C., at which point $C_2H_5ONO$ was bubbled into the reaction mixture. The nitrite addition was continued until glpc showed no further change in starting material quantities. The temperature of the mixture was then held at about 60° C. for 2 hours, cooled and then drowned in a 5% sodium bicarbonate solution. The organic phase was extracted with $CH_2Cl_2$, washed with a dilute sodium hydroxide sollution, concentrated by evaporation of solvent and isolated by distillation at 141°–148° C./0.5 mm Hg.

This same reaction can be used to prepare dialkoxy acetophenones from other acetophenone compounds have unsaturated aromatic substitutents such as 4-allyloxyacetophenone and 4-vinylacetophenone.

EXAMPLE 5

5 grams of the silicon hydride functional silicone utilized in example 1 and 0.25 grams of the product of example 4 were weighed into a 3 neck round bottom 25 ml flask equipped with magnetic stirrer and thermometer. The temperature of the cloudy mixture was brought to 100° C. and 1 drop (approximately 0.1 g) of a 2% chloroplatinic acid solution in butyl acetate was added. The addition produced an exotherm and a clear solution. After 15 minutes the reaction was terminated. The resulting product remained clear on cooling and was soluble in dimethyl silicones having 2,5 and 8% methyl-vinyl siloxane repeat units. 20% by weight mixtures of the polyphotoinitiator product in such vinyl silicones cured when exposed to UV irradiation of 70,000 microwatts/square centimeter for two minutes.

EXAMPLE 6

Diallyoxyacetophenone was prepared as follows. Diethoxyacetophenone (104 grams) and 300 ml allyl alcohol were stirred and heated with 8 grams p-toluene sulfonic acid $H_2O$. As ethyl alcohol was removed via a Dean-Stark trap another 109 mls allyl alcohol was added. The reaction was monitored by glpc until completion. The mixture was then cooled and 500 mls of saturated sodium bicarbonate solution was added. The organic fraction was separated and the aqueous fraction extracted with hexane. The organic fractions were then combined, dried, filtered and concentrated. The product was purified by distillation at 125°–130° C./0.9 mm Hg.

EXAMPLE 7

Into a 25 ml 3 neck round bottomed flask equipped with a thermometer and stirrer replaced 1 gram of diallyloxyacetophenone and 0.63 grams of pentamethyldisiloxane. The flask was placed in an oil bath at 85° C. When the temperature reached 85° C., 0.5 grams of a 2% chloroplatinic acid solution were added. After stirring for 5 minutes, 2.2 grams of an approximately 1,000 molecular weight dimethylsilicone terminated with silicon hydride (0.002 eq.H/gram) were added along with an additional 0.05 grams of chloroplatinic acid solution. An exotherm from 110° C. to 125° C. was observed. After about 5 minutes the reaction was allowed to cool producing a dark fluid product. This product was soluble in a 70,000 molecular weight silicone containing 8% by mole methylvinylsiloxane units.

A 20% solution of the product in this vinyl silicone cured a ¼ inch slug when exposed to UV irradiation of 70,000 microwatts per square centimeter for 2 minutes.

The solubility of this low molecular weight silicone photoinitiator in high molecular weight silicones was particularly surprising since a benzoin type photoinitiator prepared from the same 1,000 molecular weight silicone by the method of U.S. Pat. No. 4,391,963 was not soluble in other higher molecular weight silicones.

EXAMPLE 8

The trimethylsilyl ether of 1-benzoyl-2-allylcyclohexanol was prepared by a modification of the procedure of example IV of co-pending application No. 528,287 filed Aug. 31, 1983 and incorporated herein by reference, using equivalent amounts of benzaldehyde in place of p-allyloxybenzaldehyde and of 2-allylcyclohoexanone in place of cyclohexanone.

15 grams of the silcone hydride functional dimethyl silicone used in example 2 was reacted as in example 2 with 1.4 grams of the trimethylsilyl ether of 1-benzoyl-2-allylcyclohexanol. 0.3 grams of the resulting product was then dissolved in 3 grams of a silicone containing 8% methylvinylcyclohoexanone units. A thin film of this mixture was exposed to UV irradiation of 70,000 microwatts per square centimeter for 2 minutes producing a cured clear film.

EXAMPLE 9

Example 8 may be repeated substituting an equivalent amount of methyl allyl ketone for the 2-allylcyclohexanone utilized in that example. After the hydrosilation, the resulting polyphotoinitiator product will be represented by formula (I) where X is:

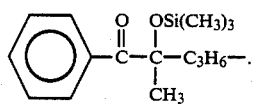

(V)

EXAMPLE 10

If Example 6 is repeated substituting an excess of a monoallyl ether of glycerin for the allyl alcohol in Example 6, a cyclic unsaturated acetal product is formed which may subsequently be hydrosilated as in Example 7 to give a polyphotoinitiator product of the invention.

The 1-allyl ether of glycerin may thus be utilized to produce a photoinitiator of the invention where X in formula (I) above is

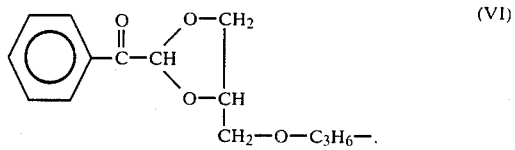

(VI)

The 2-allyl ether of glycerin can thus be utilized to give a photoinitiator of the invention where X is

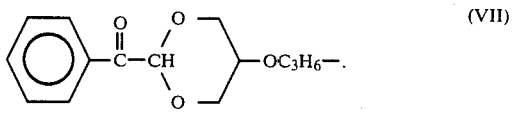

(VII)

Among the many variations of the above procedures which can be employed without departing from the invention hereof are the use of mixed saturated and unsaturated alcohols in the procedure of Example 6; substitution of acetylenic reagents for the corresponding olefinic reagents (e.g., propargyl bromide or alcohol for allyl bromide or alcohol in Examples 1, 3 and 6); blocking of one of the unsaturated groups of the diallyl product of Example 6 with other olefinically reactive reagents such as trimethylsilane, hydrogen or halogens; and acid catalyzed cleavage of the trimethylsilyl ether product of Example 8 to the corresponding alcohol, with optional subsequent esterification, etherification or reaction with other hydroxy reactive materials such as isocyanates or epoxies.

While the primary use of the inventive compounds is in the photocuring of vinyl or acrylic (i.e., acrylate, methacrylate, etc.) functional silicones, other compounds with free radical cureable functionality such as organic compounds with vinyl, acrylic, maleic, or itaconic functionalities may also be photocured with the inventive compounds as well.

We claim:

1. An organopolysiloxane photoinitiator having an average of at least two siloxane units, of which at least an average of one siloxane unit per organopolysiloxane molecule has the formula:

$$X_a R_b SiO_{(4-a-b)/2} \quad (I)$$

wherein a is an integer of 1–3, b is an integer of 0–2 and a plus b equals 1–3; R is $C_1$–$C_{10}$ hydrocarbyl or halogen substituted $C_1$–$C_{10}$ hydrocarbyl; and X is a substituted acetophenone photomoiety selected from:

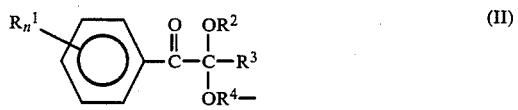

(II)

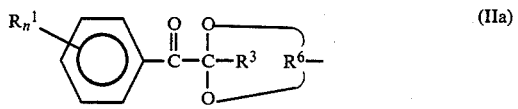

(IIa)

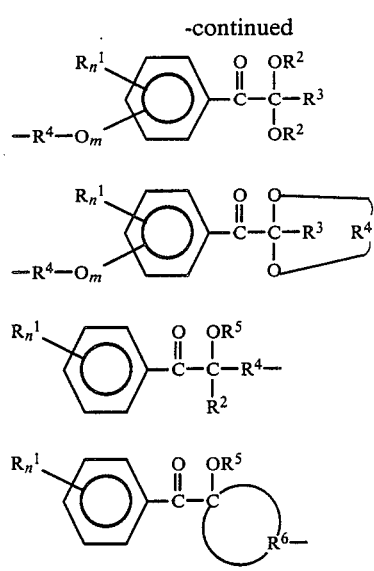

where $R^1$ is any substituent which will not interfere with hydrosilation, n is an integer between 0 and 5 in formulas (II), (IIa), (III), (IIIa), (IV) and (IVa) and between 0 and 4 in formula (III) and (IIIa); m is 0 or 1; $R^2$ is alkyl or substituted alkyl; $R^3$ is H, alkyl or aryl; $R^4$ is a divalent hydrocarbon group having between 2 and 10 carbon atoms or an alkylene oxy alkylene group; $R^5$ is a group selected from H, alkyl, aryl, organosilyl, or the reaction product of an isocyanate esterification reagent or an etherification reagent with the hydroxyl product formed when $R^5$ is H and $R^6$ is a trivalent hydrocarbon or hydrocarbon oxyhydrocarbon group.

2. A photoinitiator as in claim 1 where R is alkyl, substituted alkyl or aryl.

3. A photoinitiator as in claim 1 where $R^1$ is halo, alkyl or alkoxy.

4. A photoinitiator of claim 1 where n is 0.

5. A photoinitiator of claim 1 where X is selected from formulas II and III and $R^2$ is alkyl.

6. A photoinitiator of claim 1 where $R^4$ is propylene or propenylene.

7. A photoinitiator of claim 1 wherein X has the structure of formula IIa.

8. A photoinitiator of claim 1 wherein X has the structure of formula III and m is 1.

9. A photoinitiator of claim 1 wherein X has the structure of formula IVa.

10. A photoinitiator of claim 1 wherein X has the structure of formula IV and $R^5$ is organosilyl.

11. The method of curing a free radical curable compound having acrylic or vinyl functionality comprising subjecting to actinic radiation a composition of said compound and a photoinitiator as in claim 1.

12. The method of claim 11 wherein said curable compound is a silicone with acrylic or vinyl functionality.

13. A composition comprising a photoinitiator as in claim 1 and a free radical curable compound having acrylic or vinyl functionality.

14. The composition of claim 13 wherein said curable compound is a silicone with acrylic or vinyl functionality.

* * * * *

UNITED STATES PATENT OFFICE
CERTIFICATE OF CORRECTION

Patent No. 4,534,838  Dated  August 13, 1985

Inventor(s)  Lin et al.

It is certified that error appears in the above-identified patent and that said Letters Patent are hereby corrected as shown below:

In the abstract, line 18, delete "(III), (IIIa),".

In Col. 2, line 20, delete "(III)" and insert therefor --(IV)--.

In Col. 7, line 25, delete "(III), (IIIa),".

Signed and Sealed this

Eighth Day of November, 1988

Attest:

DONALD J. QUIGG

*Attesting Officer*  *Commissioner of Patents and Trademarks*